United States Patent
Tsukagoshi

(10) Patent No.: US 7,187,010 B2
(45) Date of Patent: Mar. 6, 2007

(54) SEMICONDUCTOR LIGHT EMITTING DEVICE

(75) Inventor: Kohji Tsukagoshi, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 92 days.

(21) Appl. No.: 11/167,327

(22) Filed: Jun. 27, 2005

(65) Prior Publication Data

US 2005/0236638 A1    Oct. 27, 2005

(51) Int. Cl.
*H01L 29/22*   (2006.01)

(52) U.S. Cl. .......................................... 257/99; 257/100
(58) Field of Classification Search .................. 257/99, 257/100, 81, 88, 690, 787
See application file for complete search history.

(56) References Cited

U.S. PATENT DOCUMENTS

2005/0236638 A1* 10/2005 Tsukagoshi .................. 257/99

FOREIGN PATENT DOCUMENTS

JP       2004-296882      10/2004

* cited by examiner

*Primary Examiner*—Mark V. Prenty
(74) *Attorney, Agent, or Firm*—Bachman & LaPointe, P.C.

(57) ABSTRACT

A semiconductor light emitting device is provided which comprises a metallic support plate 1; a semiconductor light emitting diode chip 2 mounted on a support surface 13*a* defined on an upper surface 13 of support plate 1; wiring conductors 4 mounted on side and upper surfaces 12, 13 of support plate 1 via insulators 6; and a plastic encapsulant 3 for sealing side and upper surfaces 12 and 13 of support plate 1 and a part of wiring conductors 4. As support plate 1 comprises at least one projection 16 extending from side surface 12 of support plate 1 through a notch 3*a* formed in plastic encapsulant 3 for outward exposure, heat from diode chip 2 can be efficiently diffused to the outside through projections 16 of support plate 1 extending through notch 3*a* of plastic encapsulant 3 for outward exposure, when heavy current flows through diode chip 2 through wiring conductors 4 for stronger lighting. Also, the device can selectively be mounted on a circuit board in either of the horizontal and vertical mounting structures by selectively disposing bottom surface 14 or projections 16 of support plate 1 in face of a mounting surface of circuit board and connecting lead terminal 4*d* of wiring conductor 4 to circuit board to direct light from diode chip 2 perpendicularly or parallel to circuit board.

15 Claims, 6 Drawing Sheets

SEMICONDUCTOR LIGHT EMITTING DEVICE

TECHNICAL FIELD

This invention relates to a semiconductor light emitting device, in particular of the type capable of efficiently radiating heat from a semiconductor light emitting element through a support plate to the outside and of being mounted on a circuit board in the selected one of the horizontal and upright conditions for vertically or horizontally directing the light from light emitting element.

BACKGROUND OF THE INVENTION

Japanese Patent Disclosure No. 11-340517 discloses a semiconductor light emitting device which comprises an insulating substrate formed with wiring conductors, a semiconductor light emitting element attached on a main surface of the substrate, a reflector (a light reflecting plate) surrounding the semiconductor element on the substrate, and a light-transmissible plastic encapsulant for sealing the semiconductor element and reflector wherein the insulating substrate of the semiconductor light emitting device is mounted on a circuit board in the horizontal condition.

FIG. 12 illustrates a known semiconductor light emitting device or light emitting diode which comprises an insulating substrate 100, an island wiring conductor or die pad 120 and a terminal wiring conductor or bonding pad 130 formed separately from each other on a main surface 101 of insulating substrate 100, an semiconductor element or light emitting diode chip 140 secured on island wiring conductor 120, a lead wire 150 for electrically connecting an electrode on an upper surface of semiconductor element 140 and terminal wiring conductor 130, and a light-transmissible plastic encapsulant 160 for sealing each portion of island and terminal wiring conductors 120, 130 on main surface of insulating substrate 100, semiconductor element 140, and lead wire 150.

Island and terminal wiring conductors 120, 130 extend outwardly on main surface 101 of substrate 100, then are bent downwardly along each end surface 103, 104 and moreover are bent along a bottom surface 102 of substrate 100 to form bottom contact electrodes. Light emitted from an upper or side surface of diode chip 140 is irradiated to the outside through plastic encapsulant 160. The shown light emitting diode device can be surface-mounted in the horizontal condition on a circuit board (not shown) with bottom surface 102 of substrate 100 in contact to the circuit board.

This light emitting diode device comprises a reflector 110 on main surface 101 of substrate 100 for surrounding diode chip 140. Substrate 100 is formed of glass fiber into a plate of the rectangular section with flat main and bottom surfaces 101, 102, and the plate is impregnated with resin. Island and terminal wiring conductors 120, 130 are formed by plating nickel and gold in turn on copper base materials attached to substrate 100 according to a printing technique. Island wiring conductor 120 comprises an island 121 formed on main surface 101 of substrate 100, an island electrode 122 extending from one end of main surface 101 of substrate 100 through end surface 103 to one end of bottom surface 102, and a narrow island wiring 123 on main surface 101 of substrate 100 for electrically connecting island 121 and island electrode 122.

Terminal wiring conductor 130 comprises a terminal 131 on main surface 101 of substrate 100, a terminal electrode 132 extending from the other end of main surface 101 of substrate 100 through end surface 104 to the other end of bottom surface 102, and a terminal wiring 133 on main surface 101 of substrate 100 for electrically connecting terminal 131 and terminal electrode 132. Terminal 131 is disposed out of a central line 108 to reduce a longitudinal length of substrate 100 for manufacture of light emitting diode in smaller size with reflector 110 that has a ring portion 111 on main surface 101 of substrate 100.

Semiconductor light emitting element 140 is a gallium compound semiconductor such as gallium arsenic (GaAs), gallium phosphorus (GaP), gallium aluminum arsenic (GaAlAs), aluminum gallium indium phosphorus (AlGaInP), etc. A bottom electrode (not shown) formed on a bottom surface of light emitting element 140 is secured substantially on a central portion of island 121 through an electrically conductive bonding agent. An upper electrode (not shown) on an upper surface of light emitting element 140 is connected to terminal 131 through lead wire 150 striding over ring portion 111 of reflector 110.

Reflector 110 has a ring portion 111 and flange portions 112 provided on opposite outer sides of ring portion 111 and is formed of liquid crystal polymer or ABS resin blended with white powder. Formed inside of ring portion 111 of reflector 110 is a reflecting surface 113 which is upwardly diverged or flaring to form a portion of conical, spherical or paraboloidal surface or similar surface thereto or combined surfaces thereof. A bottom end of reflecting surface 113 is positioned within island 121 to dispose light emitting element 140 inside reflecting surface 113 of ring portion 111 which is higher than light emitting element 140. Ring portion 111 is formed on the outer periphery of island 121, inner end of island wiring 123 and inner end of terminal 131. Flange portions 112 of reflector 110 are formed along opposite sides 105, 106 of substrate 100 and extends inwardly or widthwise to merge with ring portions 111.

Plastic encapsulant 160 comprises a pair of ramp surfaces 161, 162 which are positioned respectively inside of wiring conductors 124, 134, and incline respectively relative to end surfaces 103, 104 at a given angle, a pair of vertical surfaces 163, 164 which are substantially flush respectively with side surfaces of substrate 100, and a flat top surface 165 between and substantially normal to vertical surfaces 163, 164. As seen in FIG. 12, plastic encapsulant 160 seals island 121, terminal 131, each inner portion of island and terminal wirings 123, 133, reflector 110, light emitting element 140 and lead wire 150, except wiring conductors 124, 134, and each outer portion of island and terminal wirings 123, 133. Each flange portion 112 of reflector 110 has a bare side surface 114 which is flush with side surface 105 or 106 and vertical surface 163 or 164 of plastic encapsulant 160. Island and terminal electrodes 122, 132 and each outer end of terminal wirings 123, 133 extend out of plastic encapsulant 160.

Recent attempts have been made to adopt such semiconductor light emitting devices as light sources for traffic signals or rear lumps of automobile, and in this case, semiconductor light emitting devices must produce the greater light output for a viewer to certainly and visually observe turning on or off of the light source from an off position. To this end, new high power light emitting semiconductors have already been developed to produce a high intensity light when relatively large electric current for example more than 350 mA (milliamperes) is supplied to the light emitting semiconductor element. However, when the element is activated with a large electric current over 350 mA, it may heat a surface of the element to a temperature above 150° C. Accordingly, prior art semiconductor light emitting device cannot produce a high light output because heat from the light emitting semiconductor element cannot efficiently be diffused or radiated.

Also, there is another attempt for adapting the semiconductor light emitting device of this kind to a backlight source for a liquid crystal panel or the like. Such an application of the device requires a vertical mounting structure of the device capable of directing light from light emitting element parallel to a mounting surface of a circuit board on which the device is attached. Simultaneously, the device is also required to selectively form a horizontal structure capable of directing light from light emitting element perpendicularly to the mounting surface of circuit board. Accordingly, two kind of prior art semiconductor light emitting devices had to separately be formed into vertical and horizontal mounting structures with different package configurations in response to vertical and horizontal mounting on circuit board. It is therefore desirable to develop a semiconductor light emitting device of a single configuration selectively applicable to vertical and horizontal mounting.

An object of the present invention is to provide a semiconductor light emitting device capable of efficiently diffusing heat from a semiconductor light emitting element to the outside through a support plate for bearing the light emitting element when heavy current flows therethrough for stronger lighting. Another object of the present invention is to provide a semiconductor light emitting device of a single configuration selectively applicable to vertical and horizontal mounting. Still another object of the present invention is to provide a semiconductor light emitting device which can improve light directivity and axial brightness or luminance. A further object of the present invention is to provide a semiconductor light emitting device which may be manufactured by preferably injecting and filling resin within interior of reflector in forming a plastic encapsulant.

SUMMARY OF THE INVENTION

The semiconductor light emitting device according to the present invention comprises a metallic support plate (1); at least one semiconductor light emitting element (2) mounted on a support surface (13a) defined on an upper surface (13) of the support plate (1); at least one wiring conductor (4) mounted on side and upper surfaces (12, 13) of the support plate (1) via an insulator (6); and a plastic encapsulant (3) for sealing at least a portion of side and upper surfaces (12, 13) of the support plate (1) and a part of said wiring conductor (4). Support plate (1) comprises at least one projection (16) extending from side surface (12) of support plate (1) through a notch (3a) formed in plastic encapsulant (3) for outward exposure, and a bare bottom surface (14) unsealed by plastic encapsulant (3). Wiring conductor (4) has a junction end (4c) electrically connected to an electrode on semiconductor light emitting element (2) and a lead end (4d) extending to the outside of plastic encapsulant (3). When heavy current flows through semiconductor light emitting element (2) through wiring conductor (4) for intenser or stronger lighting, heat from light emitting element (2) can be efficiently diffused to the outside through projection (16) of support plate (1) extending through notch (3a) of plastic encapsulant (3) for outward exposure. Also, the device can selectively be mounted on a circuit board in either of the horizontal and vertical mounting structures by selectively disposing bottom surface (14) or projection (16) of support plate (1) in face of a mounting surface of circuit board and connecting lead end (4d) of wiring conductor (4) to circuit board to direct light from semiconductor light emitting element (2) perpendicularly or parallel to circuit board. Embedded portion of wiring conductors (4) in plastic encapsulant (3) extends along side and upper surfaces (12, 13) of support plate (1) through insulator (6) without interfering electrical connection by wiring conductor (4) between projection (16) of support plate (1) and circuit board for vertical mounting of the device.

BEST MODE FOR CARRYING OUT THE INVENTION

Embodiments of high power light emitting diodes (LED) according to the present invention are described hereinafter with reference to FIGS. 1 to 11 of the accompanying drawings.

Figure 1:
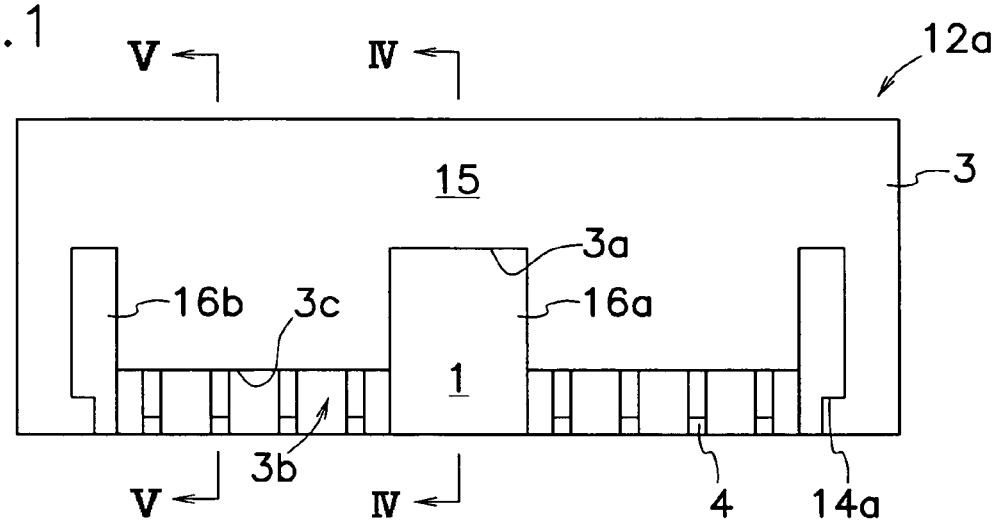
FIG. 1 is a side view indicating an embodiment of a light emitting diode according to the present invention.
Figure 2:
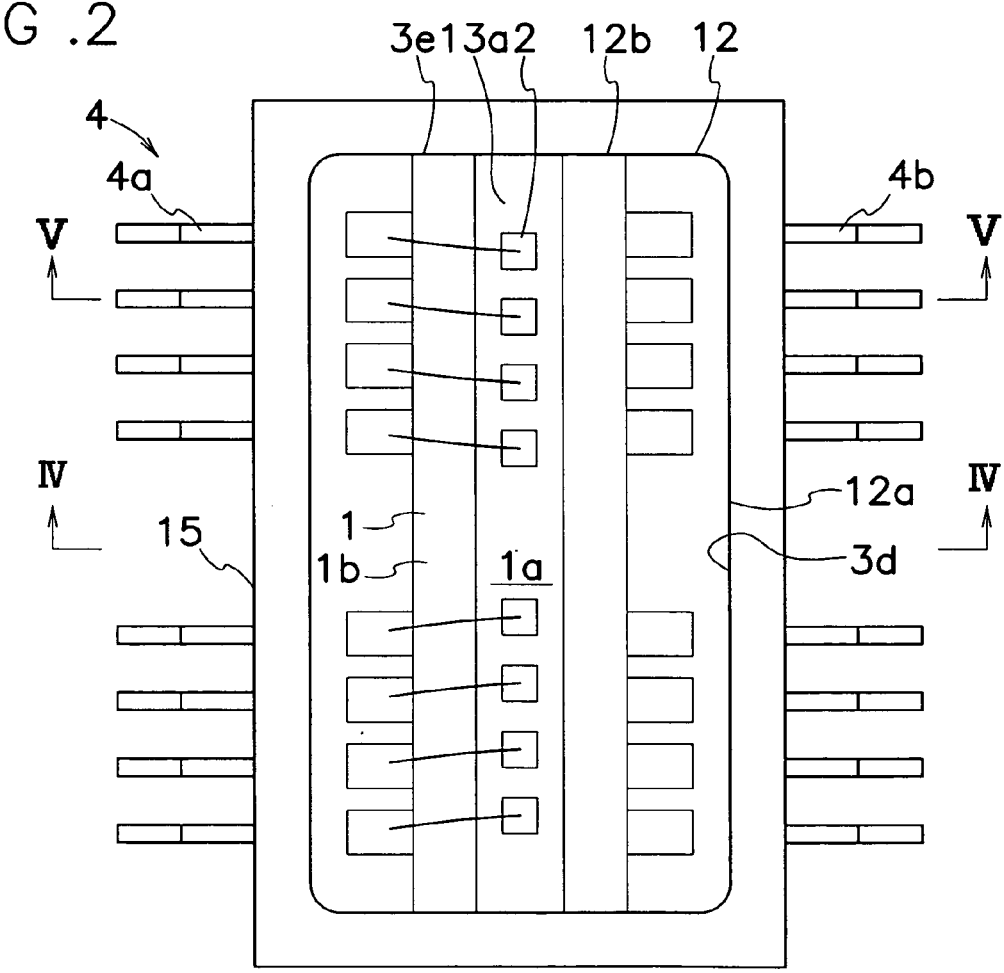
FIG. 2 is a plan view of the light emitting diode shown in FIG. 1.
Figure 3:
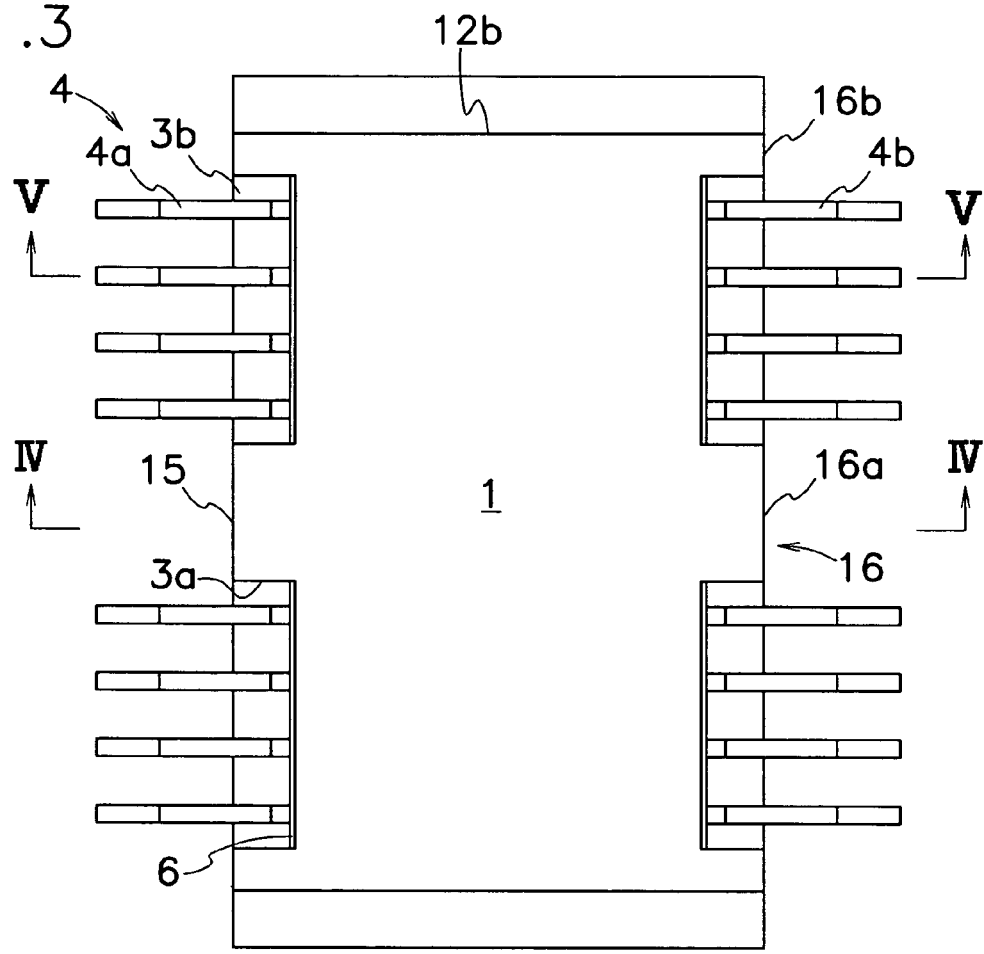
FIG. 3 is a bottom view of the light emitting diode shown in FIG. 1.

Referring now to FIGS. 1 to 3, a light emitting diode according to the present invention, comprises a metallic support plate 1; eight light emitting diode chips 2 as semiconductor light emitting elements mounted on a support surface 13a formed on an upper surface 13 of support plate 1; sixteen wiring conductors 4 attached on long side and upper surfaces 12a and 13 of support plate 1 through insulators 6 and extending from both side surfaces 12a to the outside away from light emitting diode chips 2; and a plastic encapsulant 3 sealing side and upper surfaces 12a and 13 of support plate 1 and each inner portion of wiring conductors 4.

Support plate 1 is formed of a metallic material such as copper, aluminum or copper alloy or aluminum alloy having the thermal conductivity equal to or more than 190 kcal/mh ° C. Such high thermal conductivity can directly or effectively release heat from light emitting diode chips 2 to the outside through support plate 1 when diode chips 2 is turned on with heave current passing through diode chips 2 and wiring conductors 4 to make diode chips 2 give out light with high luminance or brightness corresponding to the heavy current. In this way, metallic support plate 1 enables diode chips 2 to emit light with heavy current equal to or more than 350 mA, whereas an actual structure which incorporates a prior art light emitting diode has its relatively high thermal resistance on the order of 400° C., and the diode chips are operated with a drive current of approximately 20 mA.

Figure 4:
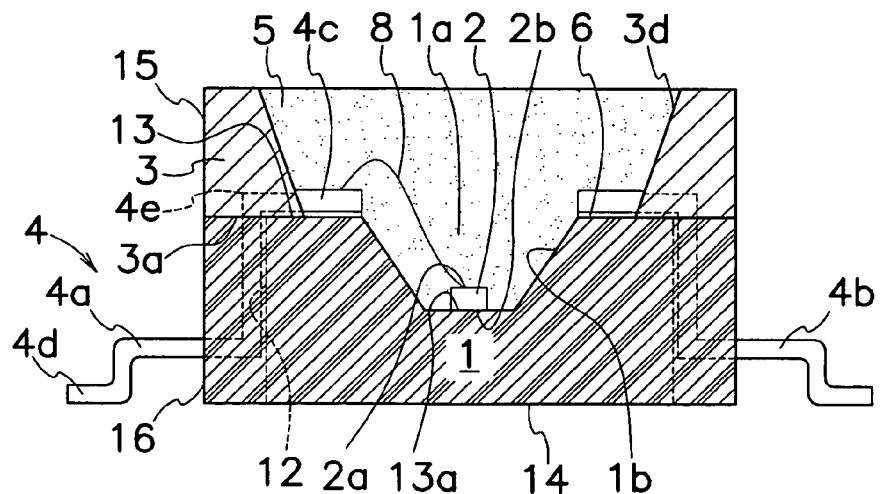
FIG. 4 is a sectional view taken along a line IV—IV in FIGS. 1 to 3.
Figure 5:
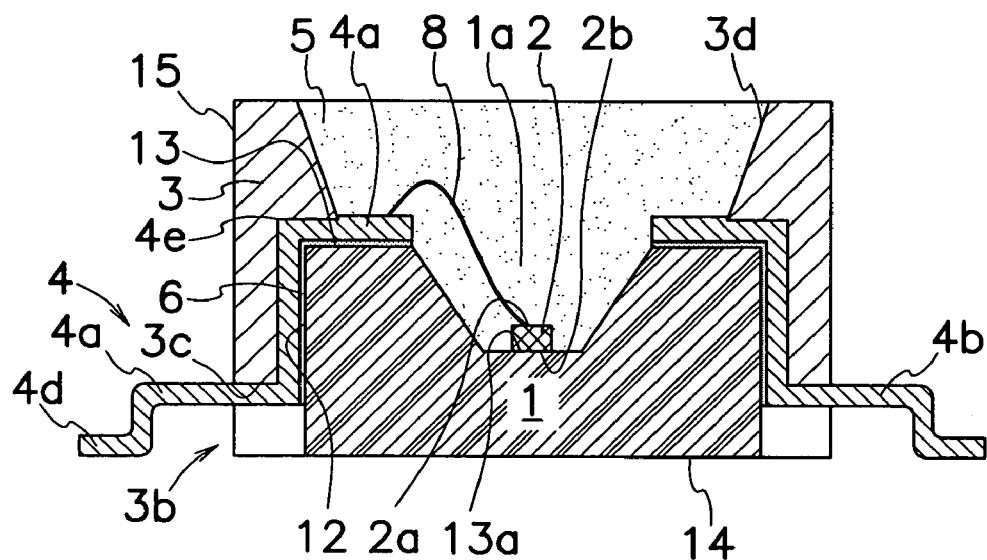
FIG. 5 is a sectional view taken along a line V—V in FIGS. 1 to 3.

FIGS. 1, 2 and 3 show respectively side, plan and bottom views of a light emitting diode according to the present invention, and FIGS. 4 and 5 illustrate respectively sectional views taken along lines IV—IV and V—V in FIGS. 1 to 3. As understood from FIGS. 1 to 5, support plate 1 in this embodiment is formed into a substantially rectangular shape having a pair of opposite long side surfaces 12a and a pair of opposite wide or short side surfaces 12b. Support plate 1 is formed with a substantially rectangular hole 1a grooved in a spaced relation to long and short side surfaces 12a and 12b. Support plate 1 has a support surface 13a on which light emitting diode chips 2 are mounted within hole 1a, and a pair of beveled or inclined surfaces 1b for defining hole 1a and surrounding diode chips 2. A pair of divergently inclined surfaces 1b have an upwardly increasing spaced distance between them away from support surface 13a to provide a light catoptrical or repercussive reflector for improvement in directivity and axial luminance of light from light emitting diode chip 2.

As shown in FIGS. 3 and 4, support plate 1 comprises projections 16 extending outward from long side surfaces 12a between upper and bottom surfaces 13 and 14 of support plate 1, and a bottom surface 14 uncovered from plastic encapsulant 3. Each projection 16 has the same height as that between upper and bottom surfaces 13 and 14 of support plate 1, but height, length and width of projections 16 can be selected as necessary, and also, projections 16 may be formed in an area of the middle or upper height or long side surfaces 12a near upper surface 13 and away from bottom surface 14 of support plate 1. As shown in FIG. 1, support plate 1 of this embodiment comprises projections 16 which each has a relatively wide protrusion 16a formed at a substantially longitudinal center on a long side surface 12a; and a pair of relatively narrow protrusions 16b on the opposite ends of long side surface 12a connected to short side surfaces 12b.

Wiring conductors 4 are made of for example highly conductive metal such as copper, each of which comprises a junction terminal 4c electrically connected to an upper electrode of light emitting diode chip 2; and a lead terminal 4d extending outward from plastic encapsulant 3. Each wiring conductor 4 is formed with a bent portion 4e at the corner of upper and long side surfaces 13 and 12a to mount it on upper and long side surfaces 13 and 12a of support plate 1 through insulator 6.

Plastic encapsulant 3 is formed of opaque or translucent resin having the high softening point and relatively high content of an additive compound or filler such as silica. When plastic encapsulant 3 is formed of heat resistive and thermosetting black epoxy resin applied to packages for power transistors and including relatively higher content of such compound than that of light transmissible resin, bonding or sealing property of plastic encapsulant 3 hardly changes or deteriorates even if heat from light emitting diode chip 2 is continuously exerted on plastic encapsulant 3. Accordingly, even in case that heat is radiated from light emitting diode 2 and there is difference in coefficient of thermal expansion between plastic encapsulant 3 and wiring conductors 4, no clearance or gap is disadvantageously formed in contact areas between plastic encapsulant 3 and wiring conductors 4 for long environmental resistance and highly reliable quality of the high power light emitting diode. For example, plastic encapsulant 3 may be formed of white epoxy resin having the improved resistance against heat or ultra-violet ray by blending filler such as silica, titanium or boron nitride into the resin.

As shown in FIGS. 1 and 5, plastic encapsulant 3 of this embodiment seals a part of upper surface 13 and cutouts 14a formed with bottom surface 14 of support plate 1 to firmly secure plastic encapsulant 3 to support plate 1 and prevent exfoliation thereof from support plate 1. As shown in FIGS. 2 and 5, plastic encapsulant 3 has a pair of divergently beveled or inclined surfaces 3d formed along long side surfaces 12a, and inclined surfaces 3d have an upwardly increasing spaced distance between them away from upper surface 13 of support plate 1 to provide a light catoptrical or repercussive reflector for improvement in directivity and axial luminance of light from light emitting diode chip 2. Also, plastic encapsulant 3 has a pair of flat vertical surfaces 3e formed along short side surfaces 12b. Accordingly, hole 1a formed by beveled surfaces 1b of support plate 1 is upwardly continuously extended by divergently inclined surfaces 3d and flat vertical surfaces 3e of plastic encapsulant 3 to fill the whole hole 1a with transparent or translucent protective resin 5 of high refractive index and high light transmission such as heat resistive silicone resin. Protective resin 5 serves to preserve light emitting diode chips 2 and lead wires 8 electrically connecting upper electrode of diode chips 2 and wiring conductors 4. Also, coating material such as light transmissible polymetaloxane or ceramics may be filled in hole 1a defined by inclined surfaces 1b of support plate 1, inclined surfaces 3d and vertical surfaces 3e of plastic encapsulant 3. In another aspect, light emitting diode device of the invention may be formed without protective resin 5.

As illustrated in FIGS. 1 and 4, plastic encapsulant 3 is formed with cutouts 3a through which projections 16 extend from each long side surface 12a of support plate 1 for outward exposure so that the number of cutouts 3a is the same as that of projections 16. In this way, projections 16 can effectively release a full amount of heat from light emitting diode chips 2 to the outside when diode chips 2 are turned on by heavy current flowing through wiring conductors 4 and diode chips 2. Each outer bare end surface of projections 16 in cutouts 3a is flush with or slightly protrudes from outer surfaces of plastic encapsulant 3.

Figure 6:
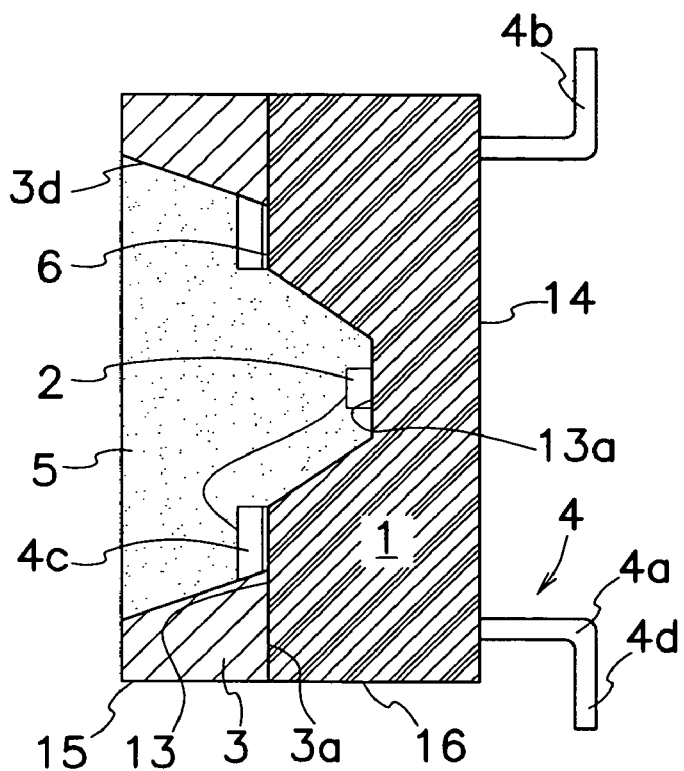
FIG. 6 is a sectional view of the light emitting diode mounted in the vertical structure.
Figure 7:
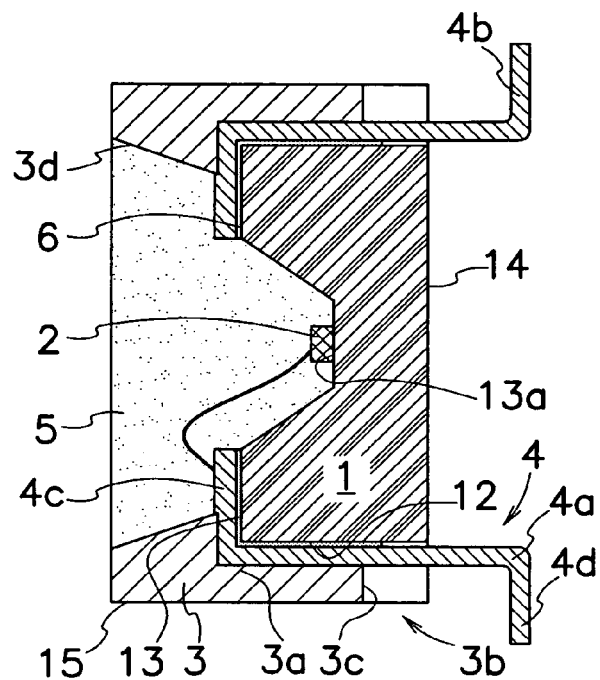
FIG. 7 is another sectional view of the light emitting diode mounted in the vertical structure.

Also, in the light emitting diode according to the present invention, semiconductor light emitting device can be mounted on a circuit board in the horizontal mounting structure (top view) as shown in FIGS. 4 and 5 to emit light from light emitting elements 2 vertically to circuit board while bottom surface 14 of support plate 1 and lead ends 4d of wiring conductors 4 are connected to corresponding areas on circuit board, but in another aspect, the device also can be mounted on circuit board in the vertical mounting structure (side view) as shown in FIGS. 6 and 7 to emit light from light emitting element 2 horizontally and parallel with circuit board while projections 16 of support plate 1 and lead ends 4d of wiring conductors 4 are connected to corresponding areas on circuit board. As wiring conductors 4 are attached on upper surface 13 and long side surfaces 12a of support plate 1 through insulator 6 and are sealed by plastic encapsulant 3, wiring conductors 4 do not bar the connection between projections 16 of support plate 1 and circuit board to firmly achieve the vertical mounting of semiconductor light emitting device. In the horizontal or vertical mounting structure, bottom surface 14 or projections 16 of support plate 1 and lead ends 4d of wiring conductors 4 are securely connected to circuit board via solder or electrically conductive adhesive. Contact area of each projection 16 to circuit board is determined to an extent capable of providing the preferable connection between projections 16 and circuit board and the better heat radiation property through projections 16.

Plastic encapsulant 3 has vertical planar surfaces 15 generally perpendicularly to support surface 13a of support plate 1, and each vertical surface 15 is formed with cutouts 3a at the middle of long side surfaces 12a of support plate 1, and bottom slots 3b extending along bottom surface 14 of support plate 1 for defining an end surface 3c of plastic encapsulant 3, and lead ends 4d of wiring conductors 4 extend outwardly through bottom slots 3b. As shown in FIGS. 1 and 5, bottom slot 3b is formed between a wide projection 16a formed at the center of long side surface 12a and a pair of narrow protrusions 16b formed at the opposite ends of long side surface 12a so that wiring conductors 4 is folded along end surface 3c away from support plate 1. In this way, projections 16 are exposed in cutouts 3a with bare end surface of projections 16 generally or substantially flash or coplanar with planar surfaces 15, and lead ends 4d of wiring conductors 4 are extended outwardly through bottom slots 3b to provide the vertical mounting structure wherein the semiconductor light emitting device is attached on circuit board while planar surface 15 of plastic encapsulant 3 confronts or comes into contact to circuit board to electrically connect projection 16 of support plate 1 and shorter lead ends 4d of wiring conductors 4 to circuit board. Otherwise, the semiconductor light emitting device can be mounted on circuit board in the horizontal mounting structure while wiring conductors 4 can be folded in bottom slot 3 away from bottom surface 14 of support plate 1 to allow bottom surface 14 of support plate 1 to directly be in contact to circuit board without interference by wiring conductors 4.

Each of light emitting diode chips 2 according to the present invention comprises an anode or upper electrode 2a electrically connected to junction terminal 4c of wiring conductor 4 through lead wire 8, and a cathode or bottom electrode 2b electrically connected to support surface 13a of support plate 1. In the horizontal mounting structure of light emitting diode device, bottom electrode 2b of semiconductor light emitting element 2 is electrically connected to circuit board through bottom surface 14 of support plate 1 so that electric current flows from upper electrode 2a through light emitting diode 2, bottom electrode 2b and bottom surface 14 to circuit board. In the vertical mounting structure of light emitting diode device, electric current flows from upper electrode 2a through light emitting diode 2, bottom electrode 2b and projection 16 to circuit board. As shown in FIG. 5, left and right wiring conductors 4a and 4b are secured to support plate 1 symmetrically or in mirror image to attach both of wiring conductors 4a and 4b on circuit board for stable and firm mounting of the diode device on circuit board, but the only left wiring conductor 4a can selectively be electrically connected to upper electrode 2a of diode chip 2 through lead wire 8. Accordingly, upper or bottom electrode 2a or 2b of diode chip 2 may be electrically connected to right wiring conductor 4b. Stable and firm mounting of the diode device prevents deviation or deflection in optical axis of light emitting diode chip 2. However, in the vertical mounting structure, wiring conductor 4b not connected to electrode of light emitting diode chip 2 may be removed. As shown in FIGS. 2 and 5, junction terminal 4c of wiring conductor 4 is formed into a wider area than the remaining portion to form a bonding pad to which one end of lead wire 8 is connected. As mentioned above, bonding pad formed by junction terminal 4c of wiring conductor 4 is mounted on upper surface 13 of support plate 1 via insulator 6 out of plastic encapsulant 3 which covers a portion of upper surface 13 of support plate 1.

Figure 8:
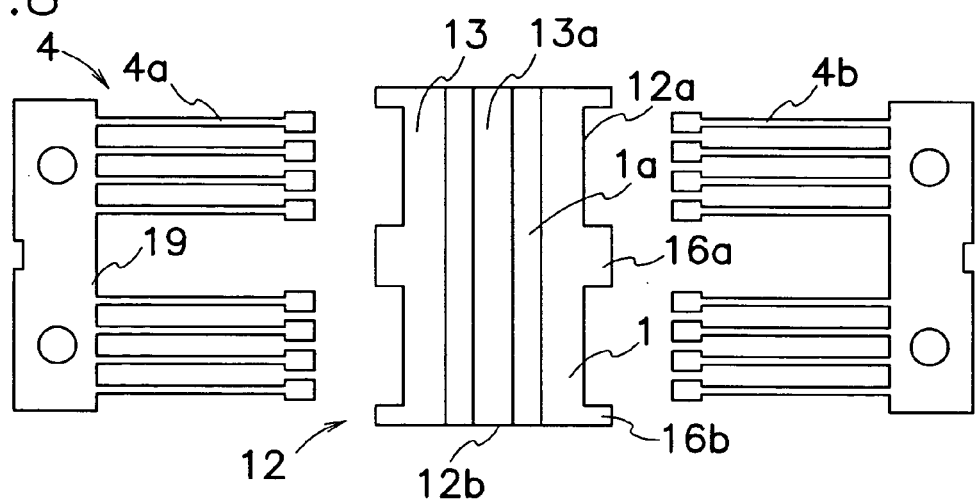
FIG. 8 is a plan view showing processes for manufacturing the light emitting diode.
Figure 9:
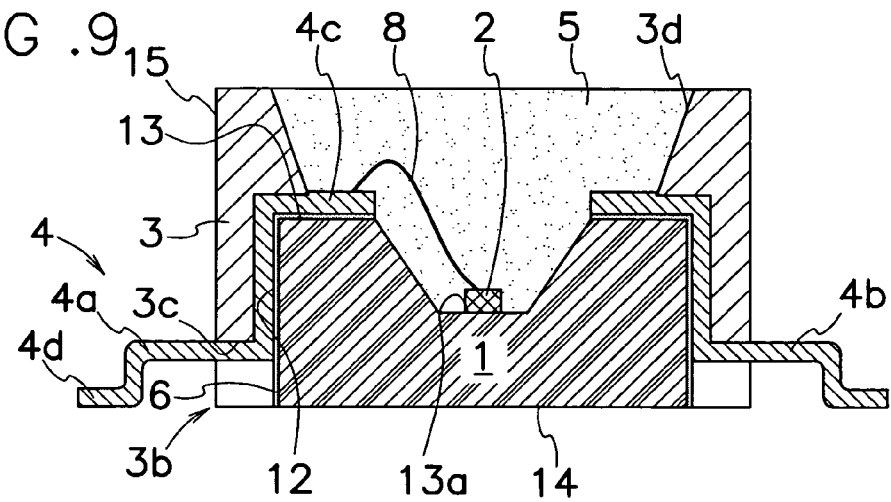
FIG. 9 is a sectional view of the light emitting diode with insulators extending along side surfaces of a support plate and terminating at the end of side surfaces.

In manufacturing light emitting diode device shown in FIGS. 1 to 7, a plurality of wiring conductors 4 are simultaneously formed as a leadframe from a metallic strip utilizing a well-known pressing technique which provides wiring conductors 4 extending from one side of connectors 19 as shown in FIG. 8. Formed by a similar pressing technique as that for wiring conductors 4 is support plate 1 which comprises upper surface 13 and long side surface 12a on which insulating tapes are attached to provide insulators 6, and wiring conductors 4 are disposed after folded to form bent portion 4e. In lieu of tapes, liquid insulating resin may be applied on upper surface 13 and long side surface 12a of support plate 1, and wiring conductors 4 are mounted on insulating resin to electrically insulate wiring conductors 4 from support plate 1. Also, insulator 6 may be formed of the same material as that of plastic encapsulant 3.

Then, plastic encapsulant 3 is formed on support plate 1 utilizing a well-known injection molding technique to seal upper surface 13, long and short side surfaces 12 of support plate 1 and wiring conductors 4 by plastic encapsulant 3. Before or after molding plastic encapsulant 3 on support plate 1, light emitting diodes 2 are bonded on support surfaces 13a of support plate 1 by means of well-known die bonder, and then, upper electrodes 2a of diode chips 2 are electrically connected to junction ends 4c of wiring conductors 4 utilizing well-known wire bonding technique. Subsequently, protective resin 5 is filled in hole 1a defined by inclined surfaces 1b of support plate 1 and inclined and vertical surfaces 3d and 3e of plastic encapsulant 3 by means of well-known dispenser. Finally, disused portions such as connectors 19 are removed from leadframe to finish a complete light emitting diode shown in FIGS. 1 to 7.

Figure 10:
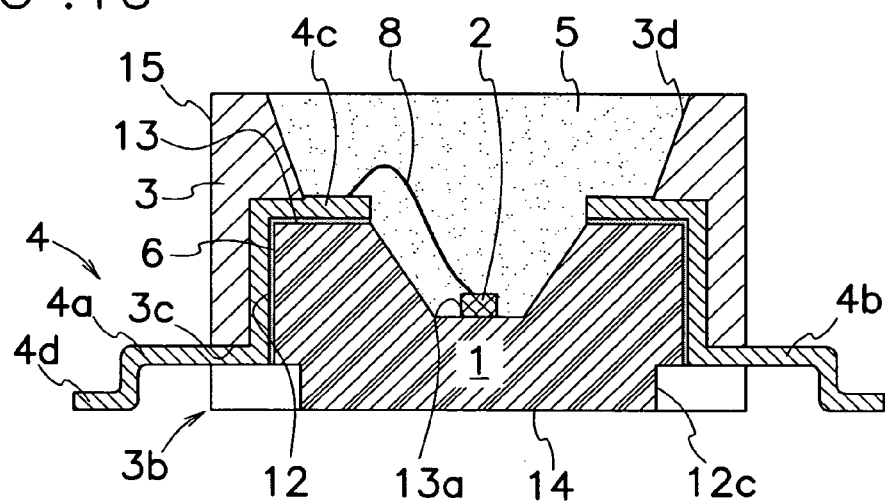
FIG. 10 is a sectional view of a light emitting diode formed with cutouts in a support plate.
Figure 11:
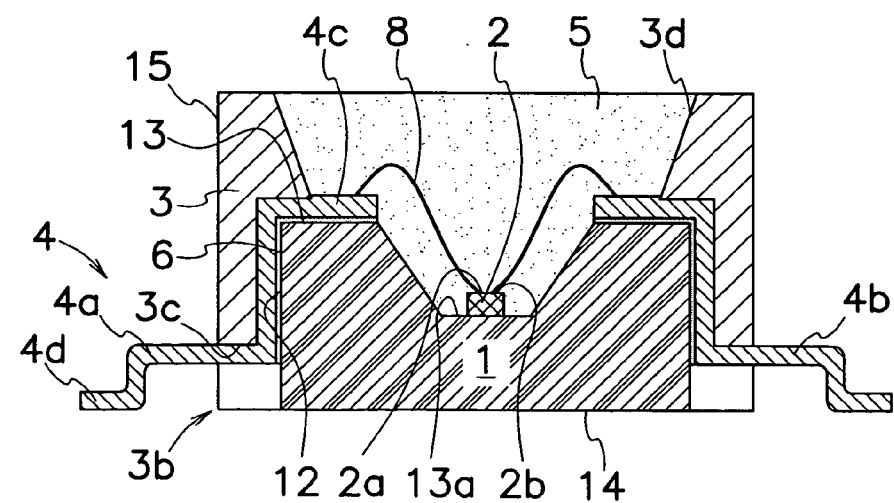
FIG. 11 is a sectional view of a light emitting diode with anode and cathode electrodes formed on an upper surface of light emitting diode chips.
Figure 12:
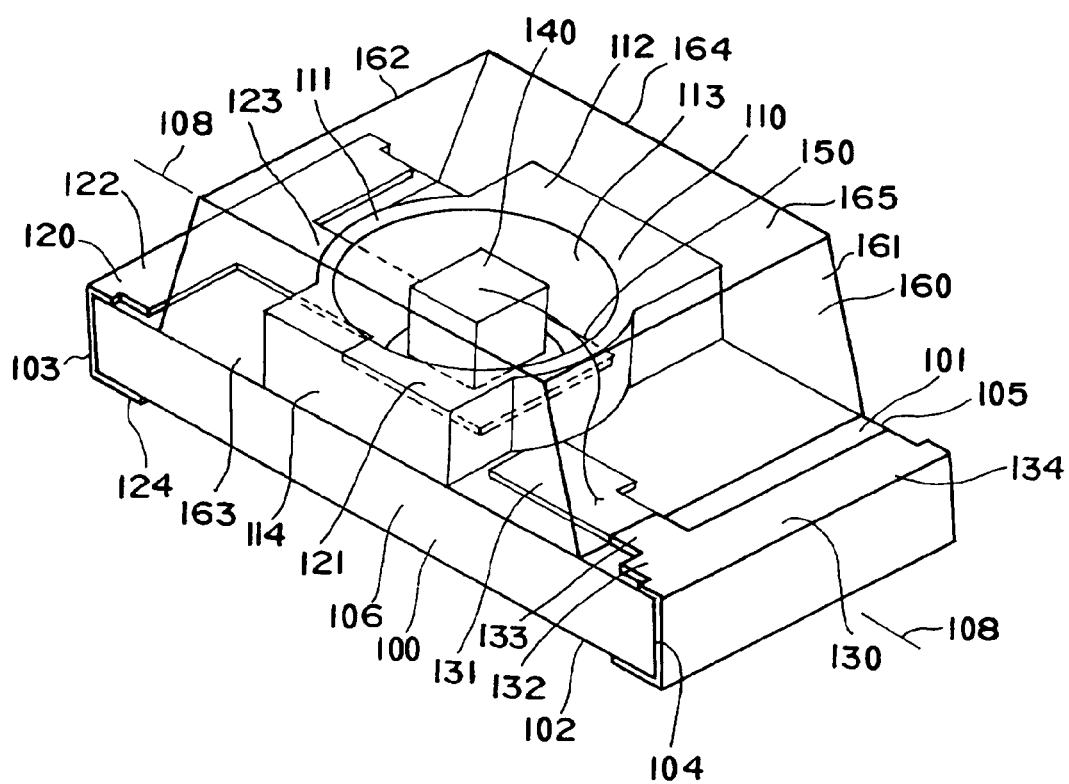
FIG. 12 is a perspective view of a prior art light emitting diode.

Embodiments of the semiconductor light emitting diode device according to the present invention can be further varied in various ways without limitation to the foregoing embodiments. For example, insulators 6 may be extended from upper surface 13 through long side surface 12a to bottom surface 14 of support plate 1. Also, as shown in FIG. 10, dents 12c may be formed on long side surface 12a along bottom surface 14 of support plate 1. These extended insulators 6 and dents 12c promote better electric insulation between support plate 1 and wiring conductors 4. Moreover, as shown in FIG. 11, light emitting diode 2 may comprise anode and cathode electrodes 2a and 2b on the upper surface to electrically connect junction terminal 4c of left and right wiring conductors 4a and 4b to anode and cathode electrodes 2a and 2b.

While the foregoing embodiments exhibit light emitting diode devices provided with eight light emitting diode chips 2, and sixteen wiring conductors 4 located on the opposite sides of diode chips 2, however, the number, arrangement and configuration of diode chips 2 and wiring conductors 4 may be determined as required, and diode chips 2 may be selected for example from the group of blue, red and green or any single color or combined color light emitting diodes. Also, support plate 1 comprises three protrusions 16a and 16b on long side surface 12a, however, the number and shape of these protrusions 16a and 16b may be modified as demanded to conform to shape or requirement of light emitting diode device. Further, short side surface 12b may comprise any projection to more improve the heat radiation property of support plate 1.

As mentioned above, the present invention can discharge heat from semiconductor light emitting element to the outside through projections of support plate extending through cutouts for outward exposure when light emitting element is illuminated with heavy current passing therethrough. Also, the semiconductor light emitting device can selectively or securely be mounted on circuit board in the horizontal or vertical mounting structure with bottom surface or projection of support plate in contact to or in face of circuit board.

What is claimed is:

1. A semiconductor light emitting device comprising a metallic support plate; at least one semiconductor light emitting element mounted on a support surface defined on an upper surface of the support plate; at least one wiring conductor mounted on side and upper surfaces of the support plate via an insulator; and a plastic encapsulant for sealing at least a portion of side and upper surfaces of the support plate and a part of said wiring conductor;

said support plate comprising at least one projection extending from said side surface of the support plate through a notch formed in said plastic encapsulant for outward exposure, and a bare bottom surface unsealed by said plastic encapsulant;

said wiring conductor having a junction terminal electrically connected to an electrode on the semiconductor light emitting element and a lead terminal extending to the outside of the plastic encapsulant.

2. The semiconductor light emitting device of claim 1, wherein a plurality of said semiconductor light emitting elements are mounted on the support surface of the support plate.

3. The semiconductor light emitting device of claim 1, wherein a plurality of the wiring conductors are mounted on side and upper surfaces of the support plate via the insulators.

4. The semiconductor light emitting device of claim 3, wherein said wiring conductors are attached in the symmetrical configuration on both of said side surfaces of the support plate.

5. The semiconductor light emitting device of claim 1, wherein a plurality of said projections extend from said side surface of the support plate through the notches formed in said plastic encapsulant for outward exposure.

6. The semiconductor light emitting device of claim 5, wherein said projections are formed in the symmetrical configuration on both of said side surfaces of the support plate through notches formed in said plastic encapsulant for outward exposure.

7. The semiconductor light emitting device of claim 1, wherein said semiconductor light emitting element comprises an upper electrode electrically connected to one terminal of the wiring conductor through the lead wire, and a bottom electrode electrically connected to the support surface of the support plate.

8. The semiconductor light emitting device of claim 1, wherein said plastic encapsulant comprises vertical planar surfaces formed with notches, said planar surface having a bottom slot formed along the bottom surface of the support plate, the other terminal of the wiring conductor extending through said bottom slot to the outside.

9. The semiconductor light emitting device of claim 1, wherein the insulator is formed of the same material as that of the plastic encapsulant.

10. The semiconductor light emitting device of claim 1, wherein the device can selectively be mounted on a circuit board in either of the horizontal and vertical mounting structures by selectively disposing the bottom surface or projection of support plate in face of a mounting surface of the circuit board and connecting lead terminal of the wiring conductor to the circuit board to direct light from said semiconductor light emitting element perpendicularly or parallel to the circuit board.

11. The semiconductor light emitting device of claim 1, wherein heat from said semiconductor light emitting element is diffused to the outside through said projection of the support plate extending through the notch of the plastic encapsulant.

12. The semiconductor light emitting device of claim 11, wherein electric current equal to or more than 350 mA can flow through said semiconductor light emitting element.

13. The semiconductor light emitting device of claim 1, wherein said projection comprises wide and narrow protrusions on the long side surface.

14. The semiconductor light emitting device of claim 13, wherein said support plate comprises at least one dent formed on said long side surface along the bottom surface.

15. The semiconductor light emitting device of claim 2, wherein said plastic encapsulant comprises vertical planar surfaces formed with notches, said planar surface having a bottom slot formed along the bottom surface of the support plate, the other terminal of the wiring conductor extending through said bottom slot to the outside.

* * * * *